United States Patent [19]
Resnick et al.

[11] Patent Number: 5,509,041
[45] Date of Patent: Apr. 16, 1996

[54] X-RAY LITHOGRAPHY METHOD FOR IRRADIATING AN OBJECT TO FORM A PATTERN THEREON

[75] Inventors: Douglas J. Resnick, Phoenix; William A. Johnson, Paradise Valley, both of Ariz.; Hector T. H. Chen, Madison, Wis.

[73] Assignee: Motorola, Inc., Schaumburg, Ill.

[21] Appl. No.: 269,866

[22] Filed: Jun. 30, 1994

[51] Int. Cl.$^6$ .................................................. G21K 5/00
[52] U.S. Cl. ........................................ 378/34; 378/35
[58] Field of Search .............................. 378/34, 35

[56] References Cited

U.S. PATENT DOCUMENTS

| | | | |
|---|---|---|---|
| 4,028,547 | 6/1974 | Eisenberger | 378/34 |
| 4,803,713 | 2/1989 | fujii | 378/35 X |
| 4,881,257 | 11/1989 | Nakagawa | 378/35 |
| 5,124,561 | 6/1992 | Faure et al. | 378/35 X |
| 5,224,139 | 6/1993 | Korenaga et al. | 378/35 X |
| 5,291,536 | 3/1994 | Itoh et al. | 378/35 |

FOREIGN PATENT DOCUMENTS

| | | | |
|---|---|---|---|
| 4130621 | 5/1992 | Japan | 378/34 |
| 5326378 | 12/1993 | Japan | 378/38 |

OTHER PUBLICATIONS

Seese et al., "Accelerated Radiation Damage Testing of X-Ray Mask Membrane Materials", Electron–Beam, X–Ray, and Ion–Beam Submicrometer Lithographies for Manufacturing III, David O. Patterson, editor, Proc. Society of Photo–Optical Instrumentation Engineers, vol. 1924, pp. 457–466 (1993).

*Primary Examiner*—David P. Porta
*Attorney, Agent, or Firm*—Bruce T. Neel

[57] ABSTRACT

An x-ray lithography method for irradiating an object (14) to form a pattern thereon uses an x-ray mask (10) having a membrane (18). The membrane (18) has an open membrane surface (26), and x-ray radiation (16) is passed through the open membrane surface (26) to irradiate the object (14). During this irradiation, the open membrane surface (26) is substantially uniformly exposed to the x-ray radiation (16) so that stress-induced distortion of the membrane (18) is reduced.

18 Claims, 1 Drawing Sheet

– 5,509,041 –

X-RAY LITHOGRAPHY METHOD FOR IRRADIATING AN OBJECT TO FORM A PATTERN THEREON

BACKGROUND OF THE INVENTION

The present invention relates, in general, to a lithography method and, more particularly, to an x-ray lithography method that reduces stress-induced distortion in an x-ray lithography mask.

An x-ray lithography mask is typically used to form a pattern in a radiation-sensitive resist layer on a semiconductor wafer surface. The mask has a membrane on which a lithography mask pattern is disposed. X-ray radiation is passed through the membrane, and more particularly the mask pattern thereon, to impinge on the resist layer so that a copy of the mask pattern is formed in the resist layer.

The conventional types of membrane materials used in an x-ray mask are typically sensitive to x-ray radiation and exhibit a change in stress with cumulative x-ray exposure. This change in stress adversely distorts the lithography pattern on the mask and leads to distortion of the pattern to be formed in the resist layer. Accordingly, it is desirable to have a method that reduces stress changes in the membrane material during x-ray lithography.

DETAILED DESCRIPTION OF THE DRAWINGS

Briefly stated, the present invention provides an x-ray lithography method for irradiating an object to form a pattern thereon using an x-ray mask having a membrane. The membrane has an open membrane surface, and x-ray radiation is passed through the open membrane surface to irradiate the object. During this irradiation, according to the method of the present invention, the open membrane surface is substantially uniformly exposed to the x-ray radiation so that stress-induced distortion of the membrane is reduced.

Figure 1:
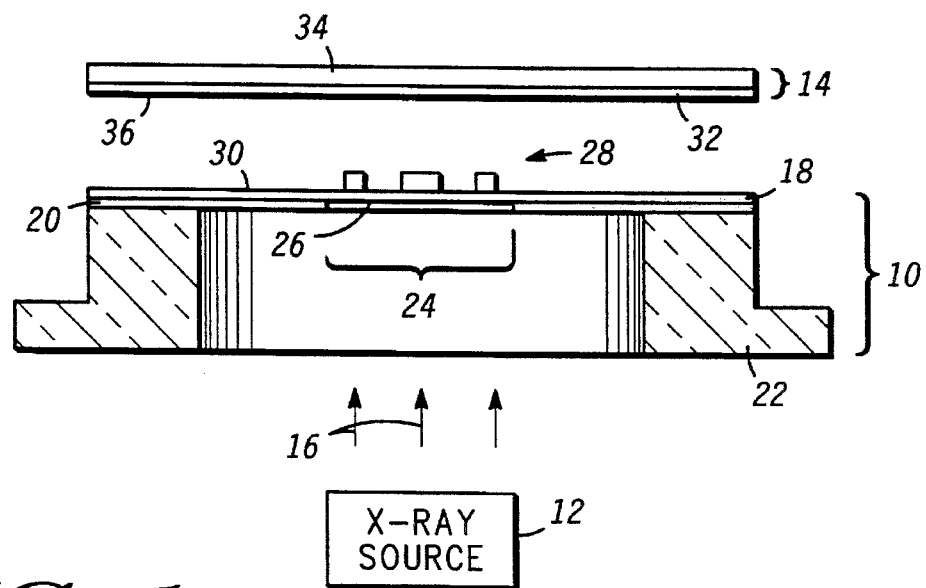
FIG. 1 illustrates a cross-section of an x-ray mask disposed between an x-ray source and an object to be irradiated with x-ray radiation in accordance with the present invention.

The present invention can be more fully described with reference to FIGS. 1–2. FIG. 1 illustrates a cross-section of an x-ray mask 10 disposed between an x-ray source 12 and an object 14 to be irradiated with x-ray radiation 16. X-ray mask 10 comprises a membrane 18 disposed on a support wafer 20 and a support ring 22 which provides a rigid base for support wafer 20. Support wafer 20 has an opening 24 therein which substantially defines an open membrane surface 26 of membrane 18. A lithography mask pattern 28 is disposed on a pattern surface 30 of membrane 18. Object 14 may be, for example, a resist layer 32 disposed on a semiconductor wafer 34 where resist layer 32 has a target surface 36 facing mask pattern 28.

According to the present invention, x-ray radiation 16 from x-ray source 12 is passed through opening 24 and lithography mask pattern 28 to irradiate target surface 36 of object 14. During this irradiation, it is important that open membrane surface 26 be substantially uniformly exposed to x-ray radiation 16 so that stress changes in the region of membrane 18 over opening 24 are minimized. An advantage thereby achieved is that distortion of mask pattern 28 is minimized so that a more accurate reproduction thereof may be transferred to resist layer 32.

Typically, the present invention is used to form a repetitive pattern in resist layer 32 such as, for example, by stepper lithography which is known. According to a preferred embodiment of the present invention, the area of open membrane surface 26 is substantially equal to the area of the repetitive pattern to be copied to resist layer 32 so that open membrane surface 26 will be uniformly exposed to x-ray radiation 16. The resulting change in stress of membrane surface 26 will therefore be uniformly affected, resulting in minimal pattern distortion. The repetition of this pattern is used to provide for example a plurality of integrated circuits (not shown) from semiconductor wafer 34.

In contrast to the present invention, a prior x-ray lithography method used aperture blades to cover a portion of the open membrane surface so that it was only partially exposed to x-ray radiation. This use of aperture blades prevented the uniform exposure of the open membrane surface because the portion of the surface covered by the aperture blades was not exposed to radiation. It has been discovered, however, that a non-uniform exposure of the open membrane surface as in this prior method leads to an unacceptably large distortion of the mask pattern due to stress changes in the membrane material. More specifically, the stress of a membrane surface exposed to x-ray radiation will be uniformly changed, whereas the stress in the area which has been covered by the aperture blades will remain unaffected. As a result, portions of the mask pattern located closest to the interface between exposed and unexposed areas of the membrane material will be significantly shifted from their original position, and thus distorted, due to the stress gradient across the interface.

For example, according to the prior method above, an open membrane surface formed of silicon carbide having an area of 50×50 mm was irradiated over an area of only 46×46 mm, as limited by aperture blades which covered a portion of the opening in the support wafer. The portion of the open membrane surface not covered by the aperture blades was exposed to cumulative x-ray radiation of about 167 kJ/cm$^2$. For this case, the silicon carbide became more compressive in the irradiated area, and as a result the membrane surface and the patterned area were displaced away from the center of the opening. For measurement purposes, this displacement is the difference between the original and final position of the mask pattern on the membrane surface. The maximum displacement occurred near the interface between the exposed and unexposed area of the membrane and had a value in either of orthogonal x or y directions of 55 nm. It should be noted that circuits with 0.25 micron critical dimensions will require pattern placement accuracy on a target surface of less than 50 nm. Thus, the displacement of 55 nm resulting from the use of aperture blades is undesirable.

In contrast to the prior aperture blade method above, and according to the present invention, an open membrane surface having an area of 50×50 mm exhibited a maximum displacement in either of orthogonal x or y directions (see FIG. 2) of only about 5 nm after the open membrane surface was exposed to cumulative x-ray radiation of about 167 kJ/cm$^2$. Mask pattern 28 exhibited about the same displacement as exhibited by membrane 18. In addition, after an exposure of this open membrane surface to cumulative x-ray radiation of about 500 kJ/cm$^2$ mask pattern 28 and membrane 18 exhibited a maximum displacement in either the x or y directions of only about 15 nm.

It is preferable that the maximum tensile stress of open membrane surface 26 be kept at less than 5×10$^9$ dynes/cm$^2$, and more preferably between 0.5 and $2 \times 10^9$ dynes/cm². Membrane surfaces which are compressively stressed are wrinkled and not suitable for x-ray lithography. Also, membranes with stresses greater than $5 \times 10^9$ dynes/cm² do not typically survive the mask-making process. When using the present invention, the average stress change over open membrane 26 is less than about six percent from an initial pre-radiation state to a state after an exposure of surface 26 to cumulative x-ray radiation of about 500 kJ/cm². This cumulative dose represents the total exposure dose that a mask typically would receive in the manufacturing run of a particular integrated circuit such as an SRAM or a DRAM.

Because membrane surface 26 is to be uniformly exposed, the intensity of the x-ray radiation impinging on membrane surface 26 preferably varies less than five percent over the full extent of surface 26. X-ray source 12 may be a conventional x-ray apparatus such as a synchrotron ring or a laser-based system.

X-ray mask 10 may be formed in many ways. As a specific example, support ring 22 may be formed of glass such as, for example, Pyrex brand glass. Membrane 18 is preferably silicon carbide, but may also be formed alternatively from boron-doped silicon, diamond, or silicon nitride as is known. Support wafer 20 is preferably a silicon wafer, and membrane 18 may have, for example, a thickness of about two microns.

Figure 2:
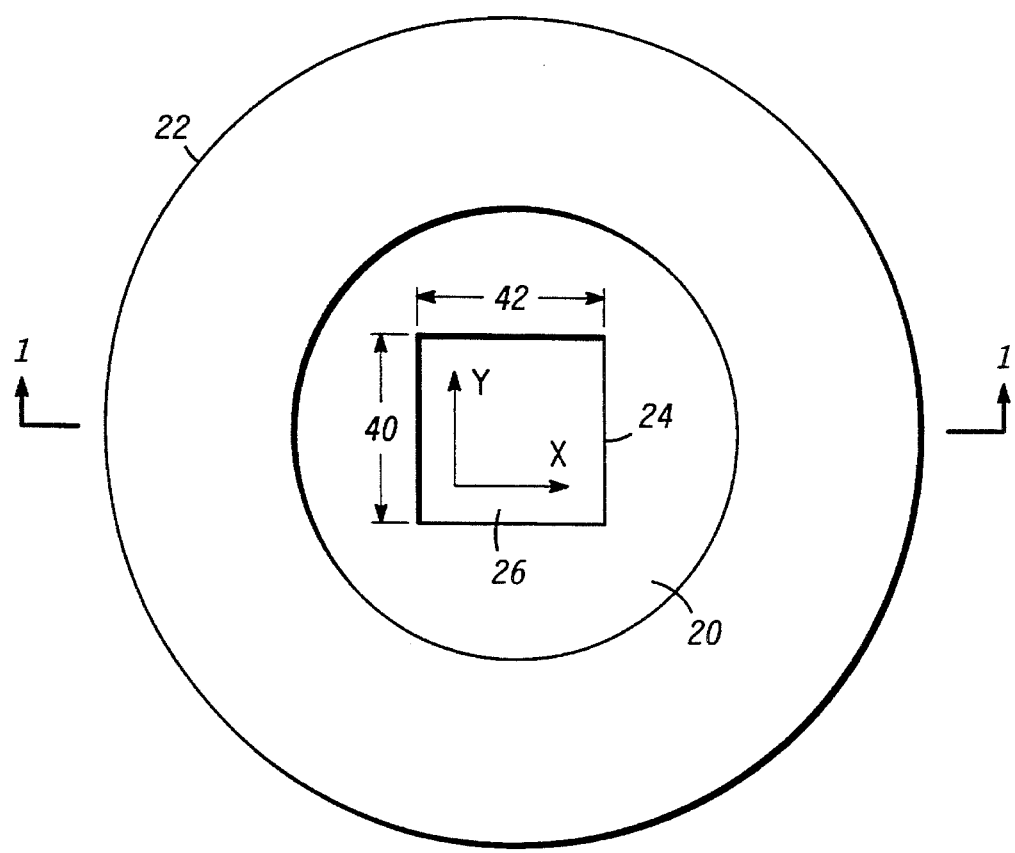
FIG. 2 illustrates a bottom view of the x-ray mask of FIG. 1.

FIG. 2 illustrates a bottom view of x-ray mask 10 of FIG. 1. Common reference numbers from FIG. 1 are used for common elements. Open membrane surface 26 is shown having a rectangular area, but may have other shapes in alternative embodiments as one skilled in the art will recognize. The area of surface 26 is indicated by dimensions 40 and 42 of opening 24, and x and y directions are indicated on surface 26. As used herein, the primary significance of these x and y directions is their indication of orthogonal directions.

The effects of radiation damage on membranes is further discussed in an article titled *Accelerated Radiation Damage Testing of X-Ray Mask Membrane Materials*, Seese et al., Electron-Beam, X-Ray, and Ion-Beam Submicrometer Lithographies for Manufacturing III, David O. Patterson, editor, Proc. Society of Photo-Optical Instrumentation Engineers, Vol. 1924, pp. 457–466 (1993), which is hereby incorporated by reference in full. In this article, four different membrane materials which are used in x-ray lithography (silicon nitride, boron-doped silicon, diamond, and silicon carbide) were irradiated with x-ray radiation to determine if any of the materials were completely resistant to changes in stress. The material which was most resistant to changes in stress was silicon carbide.

By now, it should be appreciated that there has been provided a novel method for x-ray lithography that reduces stress-induced distortion of an open membrane surface. The prior art used aperture blades to set the area of the membrane surface equal to the repetitive pattern on a silicon wafer. This induced distortion of the patterned surface that affected integrated circuit yield and eventually resulted in non-functioning integrated circuits. However, by using the present invention, it will be possible to make millions of integrated circuits, such as SRAMs or DRAMs using the same x-ray mask. Because the pattern distortion induced by the x-ray radiation is minimized, negative effects on yield will significantly be reduced.

We claim:

1. An x-ray lithography method for irradiating an object to form a pattern thereon using an x-ray mask having a membrane, said membrane having an open membrane surface, comprising the step of passing x-ray radiation through said open membrane surface to irradiate said object wherein said open membrane surface is substantially uniformly exposed to said x-ray radiation and wherein said open membrane surface has an area substantially equal to said pattern.

2. The method of claim 1 wherein said object is a semiconductor wafer, said pattern corresponds to an integrated circuit disposed on said wafer, said integrated circuit has an area substantially equal to said area of said open membrane surface, and wherein said pattern is repetitively formed on said wafer to provide a plurality of integrated circuits.

3. The method of claim 1 wherein said pattern is formed in a resist layer disposed on said object.

4. The method of claim 1 wherein an intensity of said x-ray radiation impinging on said open membrane surface varies less than 5 percent over a full extent of said open membrane surface.

5. The method of claim 1 wherein a maximum tensile stress of said open membrane surface is less than $5 \times 10^9$ dynes/cm².

6. The method of claim 1 wherein a maximum tensile stress of said open membrane surface is less than $2 \times 10^9$ dynes/cm².

7. The method of claim 1 wherein a maximum displacement of a lithography mask pattern disposed on said membrane is less than about 5 nm after an exposure of said open membrane surface to said x-ray radiation of about 167 kJ/cm².

8. The method of claim 7 wherein said membrane comprises silicon carbide.

9. The method of claim 1 wherein a maximum displacement of a lithography mask pattern disposed on said membrane is less than about 15 nm after an exposure of said open membrane surface to said x-ray radiation of about 500 kJ/cm².

10. The method of claim 1 wherein an average stress change over said open membrane surface is less than about 6 percent from an initial pre-radiation state to a state after an exposure of said open membrane surface to said x-ray radiation of about 500 kJ/cm².

11. An x-ray lithography method for irradiating a semiconductor wafer to form a repetitive pattern in a resist layer thereon for providing a plurality of integrated circuits from said wafer, comprising the steps of:

(a) positioning an x-ray mask between an x-ray source and said semiconductor wafer, said x-ray mask comprising:
  a support wafer having an opening; and
  a membrane disposed on said support wafer, said membrane having a lithography mask pattern disposed thereon and having an open membrane surface substantially coinciding with said opening, wherein said open membrane surface has an area substantially defined by said opening of said support wafer and substantially equal to an area of said repetitive pattern; and (b) exposing said open membrane surface with substantially uniform x-ray radiation to irradiate said resist layer.

12. The method of claim 11 wherein said membrane is substantially overlying a full extent of said support wafer and said open membrane surface is defined by a portion of said membrane overlying said opening of said support wafer.

13. The method of claim 11 wherein said membrane comprises silicon carbide, boron-doped silicon, diamond, or silicon nitride.

14. The method of claim 13 wherein said support wafer comprises silcon.

15. The method of claim 14 wherein said membrane of said x-ray mask is disposed on a support ring comprising glass.

16. The method of claim 11 wherein a maximum displacement of said open membrane surface in one of an x or y direction is less than about 5 nm after an exposure of said open membrane surface to said x-ray radiation of about 167 kJ/cm$^2$.

17. The method of claim 11 wherein a maximum displacement of said open membrane surface in one of an x or y direction is less than about 15 nm after an exposure of said open membrane surface to said x-ray radiation of about 500 kJ/cm$^2$.

18. The method of claim 11 wherein said membrane has a thickness of about 2 microns.

* * * * *